United States Patent [19]

Holloway

[11] Patent Number: 4,543,560
[45] Date of Patent: Sep. 24, 1985

[54] TWO-STAGE HIGH RESOLUTION DIGITAL-TO-ANALOG CONVERTER

[75] Inventor: Peter R. Holloway, Andover, Mass.

[73] Assignee: Analog Devices, Incorporated, Norwood, Mass.

[21] Appl. No.: 581,133

[22] Filed: Feb. 17, 1984

[51] Int. Cl.[4] ............................................. H03K 13/02
[52] U.S. Cl. ............................................. 340/347 DA
[58] Field of Search .................... 340/347 AD; 357/51

[56] References Cited

U.S. PATENT DOCUMENTS

| | | | |
|---|---|---|---|
| 3,997,892 | 12/1976 | Susset | 340/347 DA |
| 4,338,591 | 7/1982 | Tuthill | 340/347 DA |
| 4,447,747 | 5/1984 | La Potin | 357/51 |
| 4,491,825 | 1/1985 | Tuthill | 340/347 DA |

FOREIGN PATENT DOCUMENTS 2343092 3/1975 Fed. Rep. of Germany ...... 340/347 DA

OTHER PUBLICATIONS

Hamade et al., "A Single Chip 8 Bit A/D Converter", 02/19/76, IEEE International Solid State Circuits Conference, Digest of Technical Papers, pp. 154–155.

Hamade, "A Single Chip All-MOS 8 Bit A/D Converter", Dec. 1978, IEEE Journal of Solid State Circuits, vol. SC-13, No. 6, pp. 785–791.

Primary Examiner—William M. Shoop, Jr.
Assistant Examiner—Sharon Logan
Attorney, Agent, or Firm—Parmelee, Bollinger & Bramblett

[57] ABSTRACT

A 16-bit D/A converter formed on a single monolithic IC chip and having two cascaded stages each including a 256-R resistor-string DAC. The first stage employs a switch selector system capable of selecting any two adjacent taps of the resistor string to produce a segment voltage to be applied across the second stage resistor string. The resistor strings are formed as elongate thin film strips configured as a single, unbent body having integral voltage tap nipples evenly-spaced along both sides of the strip. Buffer amplifiers between the cascaded stages incorporate NMOS and PMOS-cascoded bipolar current sources in a non-epitaxial structure on a P-type substrate.

13 Claims, 9 Drawing Figures

Fig. 3

| SEGMENT SELECTED | CL1 | CL2 | CL3 | CL4 | CL5 | CL6 | CL7 | CL8 | CL9 | CL10 | CL11 | CL12 | CL13 |
|---|---|---|---|---|---|---|---|---|---|---|---|---|---|
| TAP 120 – 121 | 1 | 0 | 0 | 0 | 1 | 0 | 1 | 0 | 0 | 0 | 0 | 0 | 1 |
| 121 – 122 | 1 | 0 | 0 | 0 | 1 | 0 | 1 | 1 | 0 | 0 | 0 | 0 | 1 |
| 122 – 123 | 1 | 0 | 0 | 0 | 0 | 1 | 0 | 1 | 0 | 0 | 0 | 0 | 1 |
| 123 – 124 | 1 | 1 | 0 | 0 | 0 | 1 | 0 | 1 | 1 | 0 | 0 | 0 | 1 |
| 124 – 125 | 0 | 1 | 0 | 0 | 1 | 0 | 0 | 0 | 0 | 0 | 0 | 1 | 0 |
| 125 – 126 | 0 | 1 | 0 | 0 | 1 | 0 | 0 | 1 | 1 | 0 | 0 | 1 | 0 |
| 126 – 127 | 0 | 1 | 0 | 0 | 0 | 1 | 0 | 0 | 0 | 0 | 1 | 1 | 0 |
| 127 – 128 | 0 | 0 | 1 | 0 | 0 | 1 | 0 | 0 | 1 | 0 | 1 | 1 | 0 |
| 128 – 129 | 0 | 0 | 1 | 0 | 1 | 0 | 0 | 1 | 0 | 1 | 1 | 0 | 0 |
| 129 – 130 | 0 | 0 | 1 | 0 | 1 | 0 | 0 | 1 | 0 | 1 | 0 | 0 | 0 |
| 130 – 131 | 0 | 0 | 1 | 0 | 0 | 1 | 1 | 0 | 0 | 1 | 0 | 0 | 0 |
| 131 – 132 | 0 | 0 | 1 | 1 | 0 | 1 | 1 | 0 | 1 | 1 | 0 | 0 | 0 |
| 132 – 133 | 0 | 0 | 0 | 1 | 1 | 0 | 1 | 0 | 1 | 0 | 0 | 0 | 0 |
| 133 – 134 | 0 | 0 | 0 | 1 | 1 | 0 | 0 | 0 | 1 | 0 | 0 | 0 | 0 |
| 134 – 135 | 0 | 0 | 0 | 1 | 0 | 1 | 0 | 1 | 0 | 0 | 0 | 0 | 0 |
| 135 – 136 | 0 | 0 | 0 | 1 | 0 | 1 | 0 | 1 | 0 | 0 | 0 | 0 | 0 |
| 136 – 137 | 1 | 0 | 0 | 0 | 1 | 0 | 1 | 0 | 0 | 0 | 0 | 0 | 1 |

$CL1 = CL13$
$CL2 = CL12$
$CL3 = CL11$
$CL4 = CL10$

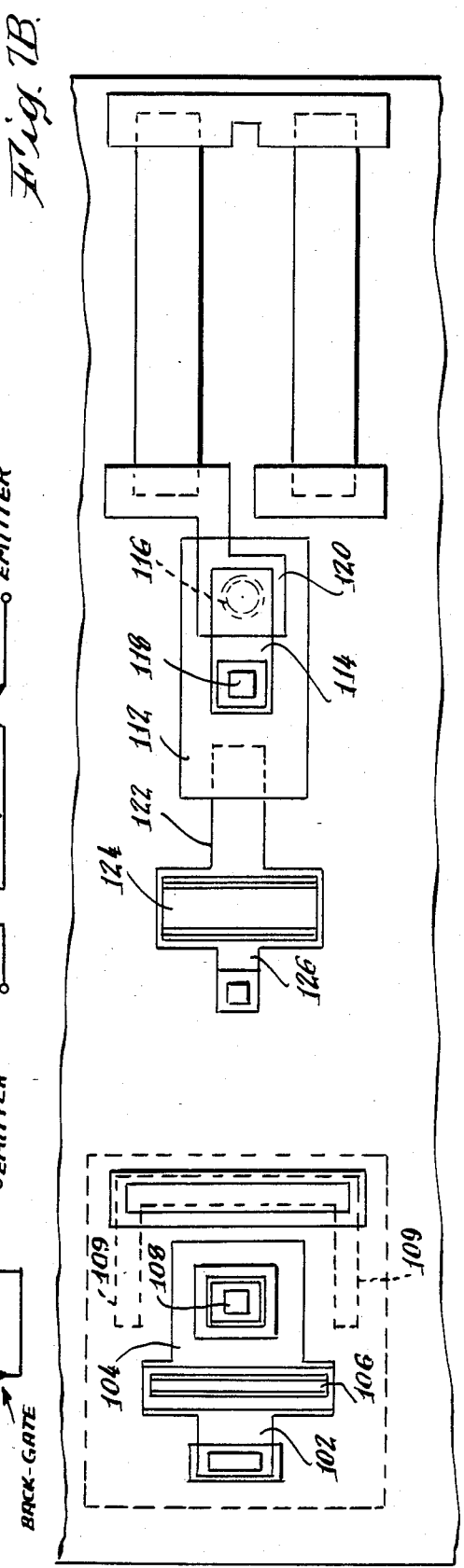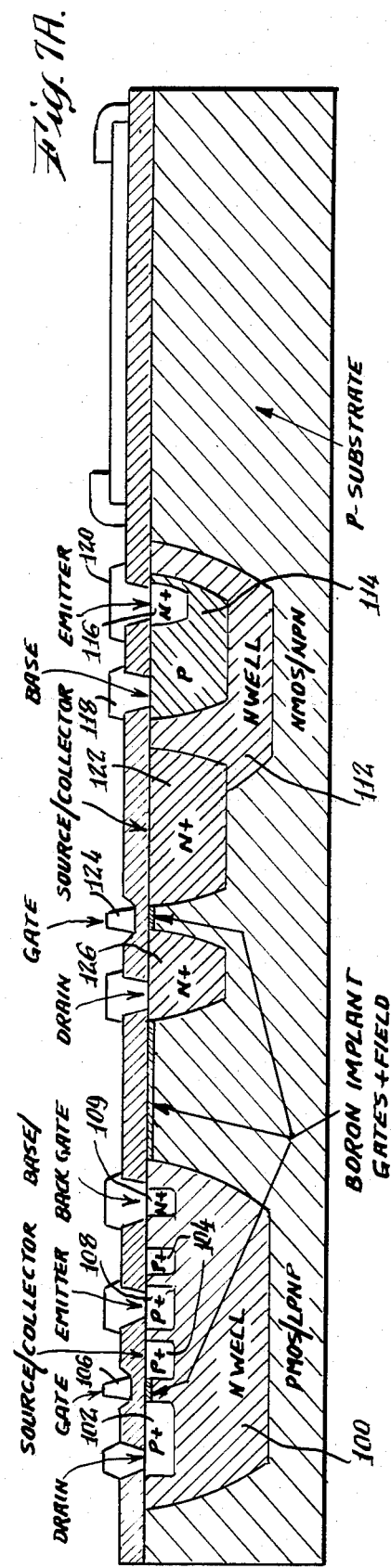

TWO-STAGE HIGH RESOLUTION DIGITAL-TO-ANALOG CONVERTER

BACKGROUND OF THE INVENTION

1. Field of the Invention

This invention relates to digital-to-analog converters of the segment type formed on a single monolithic IC chip. More particularly, this invention relates to such converters having two cascaded stages, the first stage resolving a set of higher-order bits into a corresponding analog signal, and the second stage resolving the remaining, lower-order bits to produce a second analog signal to be combined with the first stage analog signal.

2. Description of the Prior Art

Susset U.S. Pat. No. 3,997,892 shows a two-stage cascaded converter wherein the first stage includes a resistor-string DAC (D/A converter) to produce a first voltage corresponding to a set of higher-order input bits. The second converter stage is another resistor-string DAC arranged to produce a second voltage corresponding to a set of lower-order bits. The voltage across a selected resistor of the first stage is applied to the ends of the resistor string of the second stage, so that the latter stage produces an output effectively interpolating the selected first-stage segment voltage in accordance with the lower-order bits.

Converters such as shown by Susset have an important advantage in that they are inherently capable of monotonic performance. However, the Susset converter is practical only for use in relatively low-resolution applications. This is because the selector switch system used to make connection to the resistor string would become prohibitively large and complex for a high-resolution monolithic converter such as one capable of resolving a 16-bit input word. For example, the first stage of such a converter typically would have a 256-R resistor string. The complexity of the switch selector system for such a resistor string especially results from the fact that it must be able to select any pair of adjacent voltage taps of the string to produce the segment voltage for the second stage converter.

The prior art techniques used in cascaded segment converters suffer from still other disadvantages when applied to high-resolution, high performance devices developed on a single IC chip. For example, prior resistor-string arrangements have not been found suitable for achieving satisfactory linearity and other desired performance characteristics in a 16-bit converter.

SUMMARY OF THE INVENTION

In accordance with one aspect of the invention, a novel selector switch tree structure is provided for accessing the voltage tap points of a resistor string having 256 resistors. This tree structure makes it possible to use common control lines for most of the two sets of switches on opposite sides of the resistor string, and leading respectively to alternate voltage taps of the resistor string. The selection of adjacent pairs of taps is thereby effected with a minimum of additional circuitry required to control the two sets of switches.

The resistor string of the preferred embodiment is provided as a single-bodied thin film resistor in the form of a continuous homogeneous strip of resistive material (Silicon Chromium) of elongate rectangular shape, having no conductive layer contacts interposed between adjacent resistors. The disclosed structure provides improved untrimmed resistor linearity as a result of the configuration of thin film.

Still other objects, aspects and advantages of the invention will in part be pointed out in, and in part apparent from, the following description of a preferred embodiment considered together with the accompanying drawings.

BRIEF DESCRIPTION OF THE DRAWINGS

FIG. 3 presents a table partially showing the development of the signals for the switch control lines for the switch portions shown in FIG. 2.

FIG. 7A, 7B and 7C show details of N-type and P-type MOS-cascoded bipolar current sources formed with a non-epitaxial process.

DETAILED DESCRIPTION OF A PREFERRED EMBODIMENT

Figure 1:
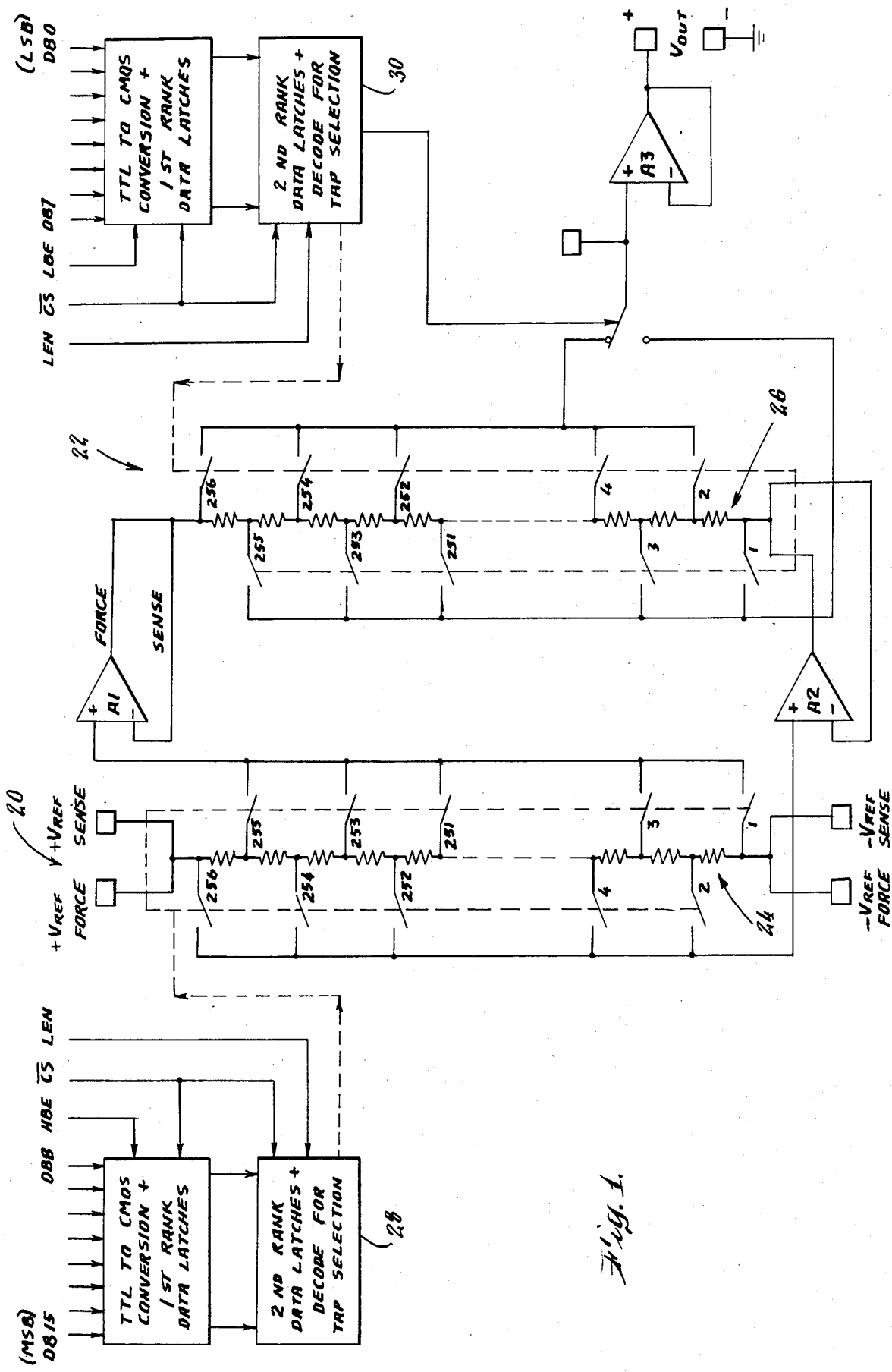
FIG. 1 is a simplified diagrammatic showing of a converter in accordance with this invention.

Referring first to FIG. 1, which is a simplified diagram of the preferred 16-bit D/A converter, it will be seen that the device includes two cascaded stages generally indicated at 20 and 22. Each stage comprises a 256-R resistor string 24, 26. Logic circuitry 28, 30 of known type of design is used to develop the switch control signals for the respective stages. Buffer amplifiers $A_1$, $A_2$ are employed to direct the first-stage segment output voltage to the second stage where it is applied to the ends of the resistor string 26.

The first stage resistor string 24 receives a voltage shown as $+V_{REF}$ and $-V_{REF}$. That voltage is divided by the resistor string into 256 nominally equal voltage segments. Any two adjacent voltage taps are selected in accordance with the upper byte (8 bits) of the 16-bit input word. Amplifier $A_1$ transfers the voltage of one selected tap (e.g. tap 251) to the top of the second stage. Amplifier $A_2$ transfers the voltage from an immediately adjacent tap (e.g. tap 252) to the bottom of the second stage. The output amplifier $A_3$ produces a signal linearly interpolating the voltage drop between taps 251 and 252, weighted by the lower byte of the 16-bit input word.

The next code might, for example, lie between taps 252 and 253, in which case the switching path represented by the switch at tap 251 opens up, and a new path is developed by closure of the switch at tap 253. With the shift of switches just described, it will seen that the polarity of the voltage supplied to the second stage converter is reversed. This reversal occurs at every other adjacent resistor segment and must be corrected in the second stage to preserve monotonic behavior. Various known reversal-correction arrangements can be employed, and thus this aspect will not be further described herein. This feature of the selector switch eliminates differential non-linearity errors resulting from dissimilar $V_{OFFSETS}$ of amplifiers $A_1$ and $A_2$. Leaving the same amplifier in a given tap's path for both the pedestal of a lower segment and the floor of the adjacent upper segment avoids any modification of the 256 major carrys, even at reduced-scale factors.

Figure 2:
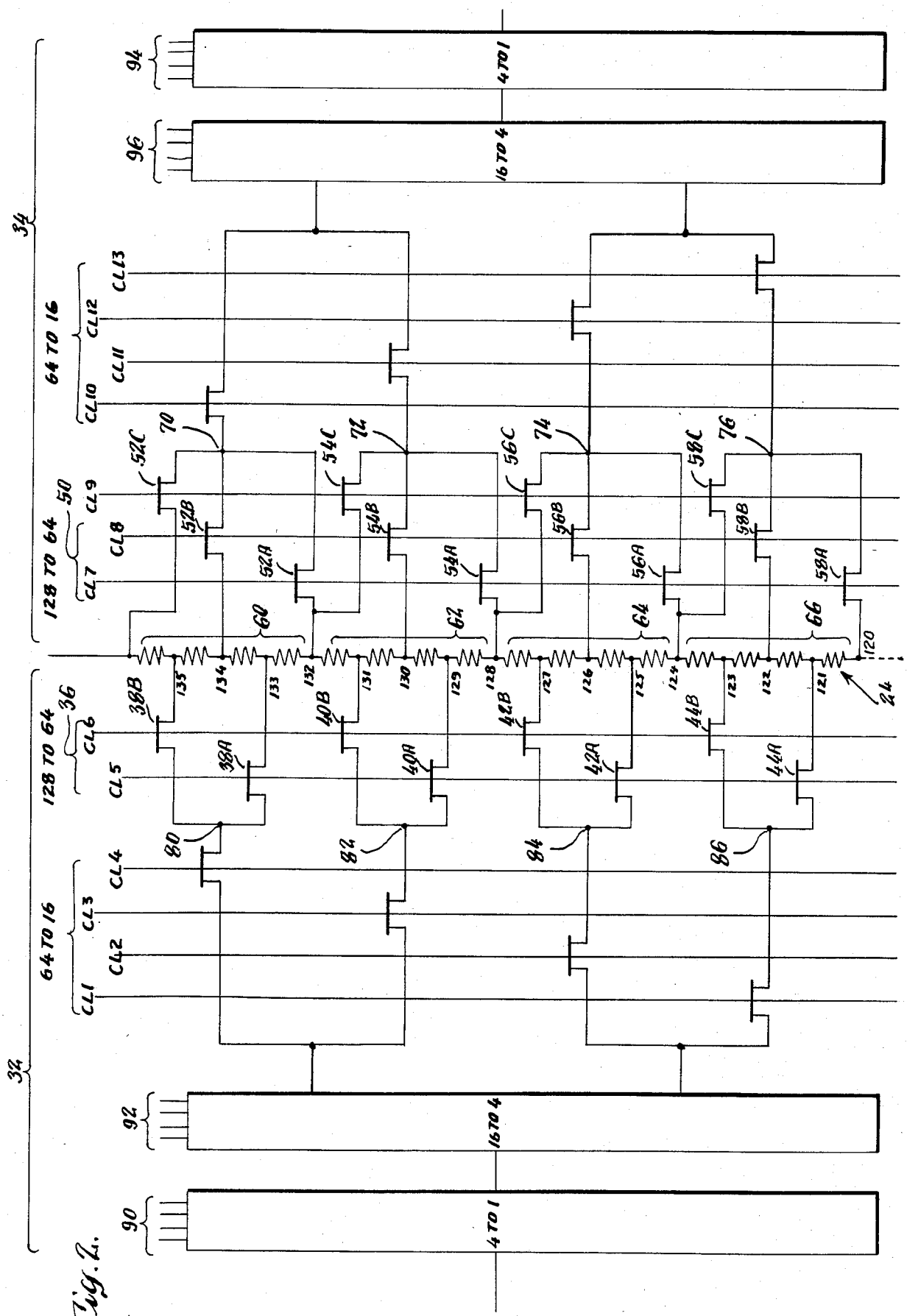
FIG. 2 is a diagram showing a portion of the voltage tap selector switches.

Referring now to details of the selector switch system shown in FIG. 2 (representing only a small portion of the resistor string), it will be seen that the system comprises two multi-rank groups of selector switches generally indicated at 32, 34, on opposite sides of the resistor string 24. Each group in this embodiment includes four ranks, so that the voltage of every resistor tap passes through four series-connected switches (in this case, NMOS FETS) before reaching an amplifier. The switching scheme, as outlined above, requires that, for a monotonically increasing input, the switchover from one resistor segment to the next occurs by having one contact "leapfrog" around the other tap, i.e. by having a single contact move two steps, rather than by having two contacts slide together one step each.

The selector trees are arranged such that their physical connections to the resistor-string do not exactly over-lap, but, instead, are interleaved. Each tap going along the resistor body alternates between the left side and the right side. In this way, when both selectors are given the same address, and are physically identical in their configuration, they connect not to the same point, but instead to two adjacent points. If one selector is than augmented by a least-significant-bit (by a count of one), that selector will move to the tap immediately on the other side of the quiescent selector's tap position.

In more detail now, the first rank 36 of the left-hand selector switches are organized in switch pairs 38A, 38B, . . . 44A, 44B. The first rank 50 on the right-hand side includes corresponding pairs 52A, 52B, . . . 58A, 58B. In considering the relationship between these switch pairs and the resistor string 24, it is convenient to view the resistor string as being sub-divided into successive groups of four series-resistors each, as indicated at 60, 62, 64 and 66. Such a group presents five taps, with the fifth tap (counting downwards) serving as the first tap of the next group down.

Each four-resistor group (e.g. 60) is associated with two corresponding switch pairs on opposite sides of the resistor string (e.g. 38A, 38B on the left, and 52A, 52B on the right). The input terminals of the left-hand switch pair are connected respectively to the 2nd and 4th taps of the resistor group (counting downwards), while those of the right-hand pair are connected respectively to the 3rd and 5th taps. Thus, each of the sets of switch pairs is connected at its input side to a respective set of successive alternate taps, and these two sets of alternate taps are in an interleaved relationship.

The 1st tap of each four-resistor group (corresponding to the 5th tap of the next group above) is connected to the input terminal of an auxiliary switch 52C, 54C (etc.) having its output connected to the respective output node 70–76 of the associated switch pair 52A, 52B, etc. The left-hand set of switches do not include such auxiliary switches. That is, the output nodes 80–86 of the left-hand switch set 36 receive signals only from the respective switch pairs 38A, 38B, etc.

The switches of sets 36, 50 are operated by control lines CL5–CL9 which are controlled together by the logic circuitry in response to bits 7 and 8 of the upper byte of the input word. The auxiliary switches 52C, etc. serve as carry devices, to make connection without having to change the status of any of the outer three ranks of switches. The outer ranks accordingly can share common control lines. Thus, the second rank switches on opposite sides of the resistor string 24 have common control lines CL1–CL4 and CL10–CL13. That is, lines CL1 and CL13 are the same, lines CL2 and CL12 are the same, etc. Similarly, the outer ranks also share common control lines, such that the four-line sets 90 and 92 are the same lines as sets 94 and 96. This arrangement avoids the need for costly digital circuitry which otherwise would be required to achieve the required tap selection.

FIG. 3 presents a logic table showing the manner in which the first-rank switch control lines CL5–CL9 are activated in accordance with the state of bits 7 and 8 of the upper byte. The line signals are developed by a 2:5 decoder forming part of the first stage logic circuitry 28. The remainder of the control lines are activated in the usual way for such selector trees.

(A word about terminology employed in the claims of this application: Reference is made at times to elements, such as switches, which are said to be "adjacent". This is not to imply that they are necessarily physically next to one another on the IC chip, although that could well be the case. It means, rather, that the switches are "adjacent" with reference to the location of their corresponding connections to the voltage taps of the resistor string. The word "successive" as applied to switches similarly refers to the relationship of the switch connections to the resistor string taps.)

Establishing connection to the voltage taps of the resistor string 26 of the second converter stage presents a simpler problem than that of the first stage, for only one tap connection need be made for each conversion. However, the 256-R resistor string and selector switch system of FIG. 2 can if desired be used with the second converter stage. Such a structure, in conjunction with low-byte XOR'ing, allows the address to be 2's complemented. This permits the reversed voltage segments to be contiguously scanned along with the unreversed ones.

Figure 4:
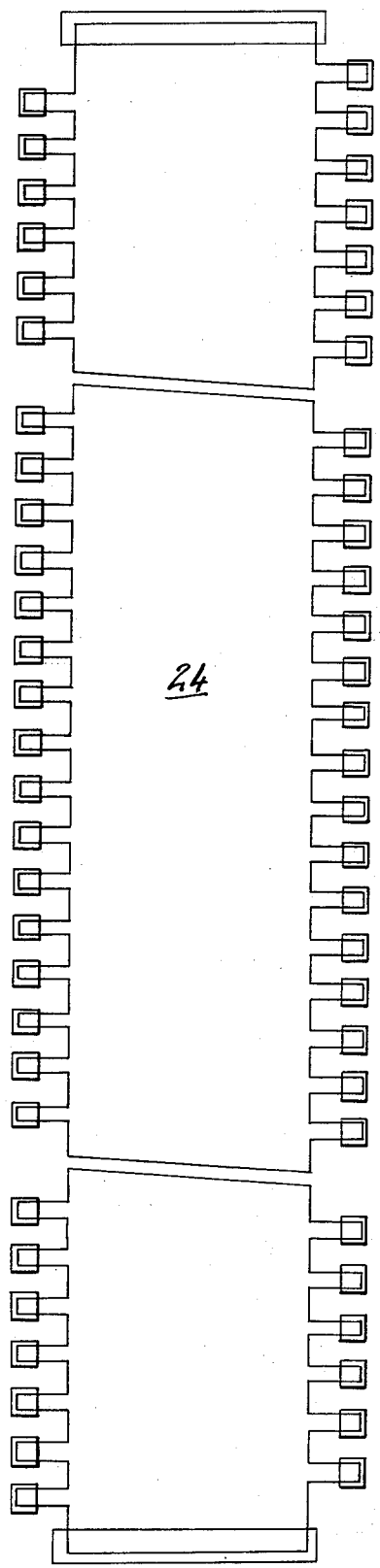
FIG. 4 shows the chip layout of the resistor string.
Figure 5:
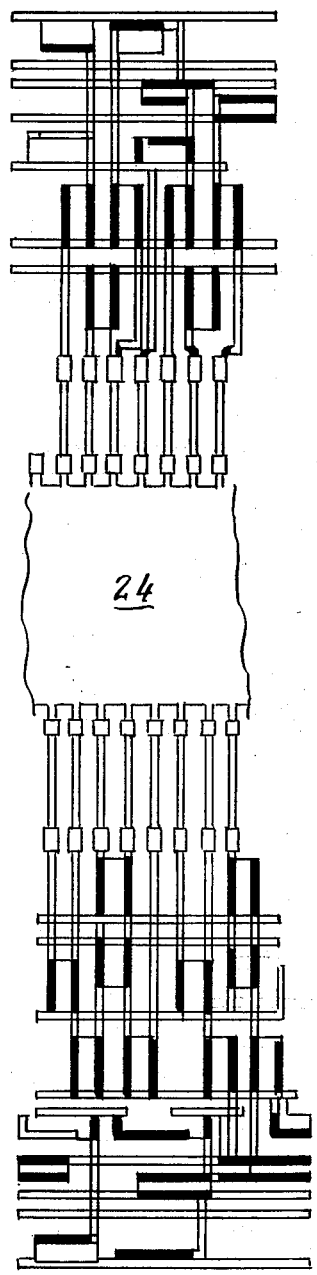
FIG. 5 shows a portion of the resistor string connected to the associated switches.

Referring now to FIG. 4, the resistor string 24, 26 is formed on the IC chip as a thin film of Silicon Chromium. It is an elongate flat strip of metal having evenly-spaced nipples extending out from both sides to serve as voltage taps. To achieve a high degree of linearity, it is important that the resistor string be geometrically homogeneous, e.g. that each repeat (such as similar sections including an even number of nipples) of the strip be the same as every other such repeat. The term "isomorphous" appears properly descriptive. Expressed from a different perspective, the resistor structure should be free from any folding or serpentine-like patterns, i.e. it should be a single, uniform unbent body. FIG. 5 shows further details.

It also is important that there be no interresistor discontinuity such as caused by metallization. Advantageously, the nipples should be longer (laterally, with reference to the resistor string) than they are wide. Preferably the length-to-width ratio should be at least 2:1. This avoids interaction between the selection of any voltage tap and the current distribution in the adjacent resistor section. A resistor string as implemented herein avoids effects on linearity of contact resistance and any misalignment between conductive and resistive layers, and also avoids the effects on linearity of folded or similar repeated structures.

Figure 6:
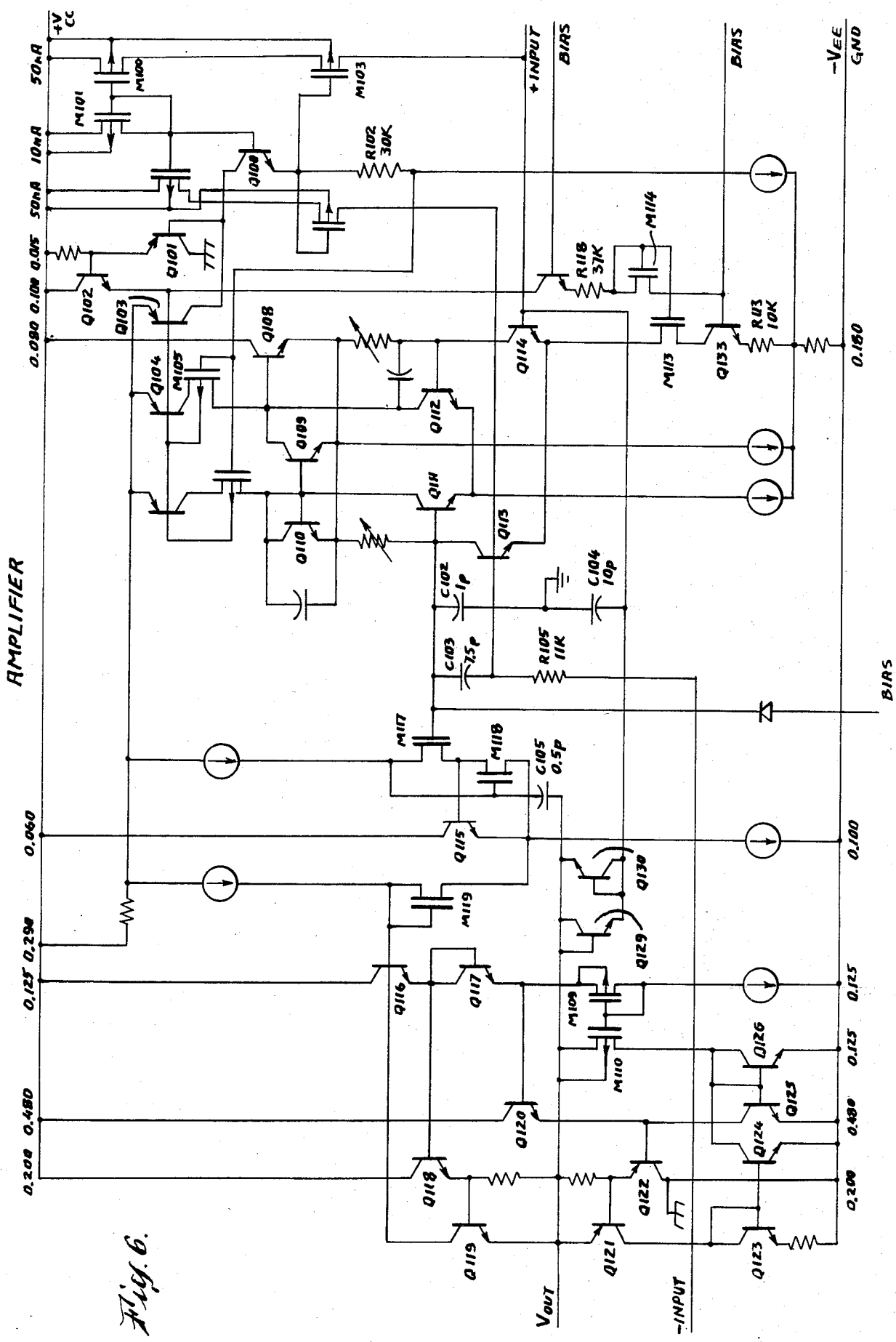
FIG. 6 is a circuit diagram of a preferred amplifier.

A converter constructed in accordance with the principles described herein displayed carry errors typically in the 19-bit range without any trimming. Integral linearity is a function of resistor accuracy, and a typical range is 0.003% to 0.01%. FIG. 6 shows a simplified circuit diagram of an amplifier suitable for use as amplifiers $A_1$, $A_2$ and $A_3$. These amplifiers were specified to settle to 16 bits in 3μs and simultaneously be high precision dc op-amps. The amplifier includes a single differential gain stage $Q_{113}$, $Q_{114}$, which uses an immittance inverter $Q_{108-112}$ as a load, followed by an MOS/bipolar unity gain impedance buffer. This dominant pole compensated amplifier achieves an $A_{VOL}$ of $10^6$ through the use of bootstrapping. This minimizes the signal dependent $V_{CB}$ modulation in $Q_{113, 114}$ and raises the differential load impedance of the gain stage by a factor equal to the loop gain of the amplifier formed by $Q_{108-112}$, and, finally, linearizes the MOS/bipolar unity gain buffer by making $V_{DS}$ track between $M_{117}$ and $M_{119}$.

To preserve open loop gain, all current sources (shown as an arrow-in-a-circle) are MOS cascoded bipolar structures. Details of one such current source are shown at $M_{113}$ and $Q_{113}$. The resulting impedance enhancement afforded by the reverse voltage transfer ratio of the FET permits an Early voltage of $10^6$ volts to be achieved at the drain of $M_{113}$. Similarly, $Q_{104}$ and $M_{105}$ provide the same advantage for sources originating from the positive supply, side-stepping the inherently low impedance of the split vertical/lateral PNP's which are problems to form in non-epitaxial processes. $I_b$ compensation is provided by a PMOS current reflector, operating in subthreshold, shown in part by $M_{101-103}$ and $Q_{100}$. The Darlington NPN/vertical output stage has an $I_b$ booster for the output VPNP, $Q_{122}$. $M_{109, 110}$ in conjunction with $Q_{125,126}$ boosts the base drive into the output when $V_{OUT}$ lags the voltage at the emitter of $Q_{117}$ under negative slew. The amplifier occupies 1500 mil$^2$ and settles to 10 ppm in 3 μs.

The configurations of such P-type and N-type MOS-cascoded bipolar current sources are shown in FIGS. 7A and 7B, representing the cross-section and plan views respectively of the devices. FIG. 7C shows the electrical circuit representation of each device, approximately aligned with the corresponding elements of FIGS. 7A and 7B.

Referring now to the left-hand portion of FIGS. 7A and 7B, the non-epitaxial P-type substrate is formed with the usual N-well 100. At the left end of the N-well is a first P-type diffusion 102 of generally rectilinear outline which serves as the drain of a PMOS device. The source of this device is formed by a second P-type diffusion 104 having its principal portion arranged as a square-shaped ring. The PMOS gate 106 is positioned between the source and the drain.

Within the square ring of diffusion 104 is another P-type diffusion 108 which serves as the emitter of a lateral PNP transistor. The N-type material of the N-well serves as the base of this transistor, and connection is made to the base by an N+ diffusion 109 of generally U-shape and extending partially around the square-ring P-type diffusion 104. The collector of the LPNP is formed by the latter diffusion 104. Thus it will be seen that this diffusion serves as both the collector of the LPNP and the source of the PMOS device.

Since both of these functions are performed by the same diffusion, the PMOS source and the PNP collector are effectively connected together electrically, without any need for bridging metallization. That is, no additional layer of metal has to be added to the substrate to make this connection, which is illustrated in the circuit diagram of FIG. 3C at 110.

No electrode is provided for the P-type diffusion 104, since no external connection is needed to be made to the source/collector of the MOS-bipolar current source. Electrodes are provided for the PMOS drain and for the base and emitter of the LPNP transistor.

A distinct characteristic of the PMOS-bipolar current source is that the entire circuit is integrated into a single N-well, which affords important benefits in carrying out the process.

Turning now to the right-hand portion of FIGS. 7A and 7B, there is shown another N-well diffusion 112 within which is a P-type diffusion 114 containing another N-type diffusion 116. These three elements function respectively as the collector, base and emitter of an NPN transistor. Base and emitter electrodes 118, 120 are formed above the substrate to make the necessary connections.

The N-well 112 is effectively extended laterally by means of an N+ diffusion 122 which overlaps the initial N-type diffusion. The N+ diffusion reaches to a region alongside a gate electrode 124, and a further N+ diffusion 126 is made on the other side of the gate. This latter diffusion serves as the drain of an NMOS device. The source of this device is formed by the N-type material with the N-well 112.

Thus, it will be seen that the N-well 112 (which in this embodiment includes extension 122) serves as both the source of an NMOS device and the collector of an NPN transistor. Accordingly, these two elements are effectively electrically connected, as indicated at 128 in FIG. 7C, without the need for a metallization layer. The inclusion of diffusion 122, a low resistivity source-drain diffusion comparable to that routinely used in N-MOS and CMOS fabrication, is to enhance the performance of the composite structure through the reduction of the ohmic resistance diagrammatically represented as path 128 in FIG. 7C. The operation of this invention is otherwise unaffected by the omission of 122.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. A two-stage cascaded digital-to-analog converter wherein the first of said stages comprises a series-connected string of resistors energized by a source of voltage so that the resistor taps present progressively differing voltage levels;

an improved switch arrangement for selecting pairs of adjacent taps in accordance with higher-order code bits, thereby to develop segment voltages to be directed to said second converter stage for interpolation in accordance with lower-order code bits, said switch arrangement comprising:

a first set of switches having input and output terminals, said input terminals being connected respectively to a first set of alternate taps of said resistor string;

said first switch set being organized in pairs of first and second switches having their input terminals connected to successive alternate taps and having their output terminals connected together to form a first set of output nodes;

a second set of switches having input and output terminals, said input terminals being connected respectively to a second set of alternate taps of said resistor string;

said second set of alternate taps being interleaved with said first set of alternate taps;

said second switch set being organized in pairs of first and second switches having their input terminals connected to successive alternate taps and having their output terminals connected together to form a second set of output nodes;

a third set of switches having input and output terminals, each of said third set of switches being associated with a corresponding one of said pairs of switches of said second set of switches;

each of said output terminals of said third set of switches being connected respectively to the output node of its corresponding pair of switches of said second set;

the input terminal of each of said third set of switches being connected to the input terminal of the adjacent one of the next successive pair of said second set of switches; and switch activating means for controlling said switches to select any pair of adjacent taps in accordance with a set of code bits.

2. A converter as claimed in claim 1, wherein said converter is formed on a single monolithic IC chip.

3. A converter as claimed in claim 2, wherein said second stage comprises a resistor string similar to that of said first stage.

4. A converter as claimed in claim 3, wherein said converter stages comprise 256-R resistor strings.

5. A two-stage cascaded digital-to-analog converter wherein the first stage comprises a series-connected string of resistors energized by a source of voltage so that the resistor taps present progressively differing voltage levels;

said string of resistors being sub-divided into successive groups each having four resistors presenting five taps, with the fifth tap of one group serving as the first tap of the next adjacent group;

an improved switch arrangement for selecting pairs of adjacent taps in accordance with higher-order code bits, thereby to develop segment voltages to be directed to the second converter stage for interpolation in accordance with lower-order bits, said switch arrangement comprising:

a first set of switch pairs comprising first and second switches having input and output terminals, the input terminals of each pair being connected respectively to the second and fourth taps of a corresponding one of said resistor groups;

the output terminals of each pair of said first set of switch pairs being connected together to form a first set of output nodes;

a second set of switch pairs comprising first and second switches having input and output terminals, the input terminal of each pair being connected respectively to the third and fifth tap of a corresponding one of said resistor groups;

the output terminals of each pair of said second set of switch pairs being connected together to form a second set of output nodes;

a third set of switches having input and output terminals, each of said third set of switches being associated with a corresponding one of said second set of switch pairs;

each of said output terminals of said third set of switches being connected respectively to the output node of its corresponding pair of switches;

the input terminal of each one of said third set of switches being connected to the first tap of the group of resistors associated with said corresponding second set of switch pairs; and switch activating means for controlling said switches to select any pair of adjacent taps in accordance with a set of code bits.

6. A converter as claimed in claim 5, wherein said switches all are formed on a single monolithic IC chip as NMOS devices.

7. A converter as claimed in claim 6, wherein said resistor string comprises 256 resistors, said sets of switches providing a 256 to 64 selection; and three further ranks of selector switches, wherein the outer rank provides a 4 to 1 selection, the next provides a 16 to 4 selection, and the third provides a 64 to 16 selection.

8. A converter as claimed in claim 7, wherein said resistor string is formed on the chip as an elongate thin film of metal which is geometrically homogeneous.

9. A converter as claimed in claim 8, wherein said thin film is free of inter-resistor metallization; and a plurality of nipples formed integrally with said thin film and extending out laterally on both sides of said thin film to serve as voltage taps to the resistor.

10. A two-stage cascaded digital-to-analog converter wherein the first stage comprises a series-connected string of resistors energized by a source of voltage so that the resistor taps present progressively differing voltage levels;

said string of resistors being sub-divided into successive groups of equal numbers of resistors having taps to which connection can be made, the end tap of one group serving as the first tap of the next adjacent group;

an improved switch arrangement for selecting any pair of adjacent taps in accordance with a higher-order set of code bits, thereby to develop a segment voltage to be delivered to said second stage converter for interpolation in accordance with a lower-order set of code bits, said switch arrangement comprising:

a first set of switch groups each comprising a plurality of switches for making connection to any one of a first set of alternate taps of a corresponding resistor group and to produce the selected voltage level on a corresponding output node;

a second set of switch groups each comprising a plurality of switches for making connection to any one of a second set of alternate taps of a corresponding resistor group and to produce the selected voltage level on a corresponding output node;

said first and second sets of alternate terminals being interleaved;

a third set of switches each assigned to a corresponding one of said second set of switch groups;

the output terminals of said third set of switches being connected respectively to the output nodes of the assigned switch groups;

the input terminal of said third set of switches being connected respectively to an end tap of the resistor group corresponding to the assigned switch group; and switch activating means for controlling said switches to provide for selecting any pair of adjacent voltage taps in accordance with the higher-order set of code bits.

11. A two-stage cascaded D/A converter formed on a single monolithic IC chip for converting a 16-bit word into a corresponding analog signal, and wherein the first stage comprises a 256-R resistor string connected to a switch selector system to produce segment voltages representing the voltage between any two adjacent taps of the resistor;

said resistor string comprising an elongate geometrically flat strip of Silicon Chronium formed on said IC chip as a single geometrically homogeneous element, free from folding or serpentine patterns;

means to apply a voltage to the ends of said elongate strip;

a plurality of selector switches formed along-side said elongate flat strip, on both sides thereof; and means connecting said switches to evenly-spaced points along the side edges of said strip.

12. A converter as claimed in claim 12, wherein said strip is integrally formed with a plurality of nipples evenly-spaced along both side edges of the strip and extending out laterally from both sides thereof; and means connecting the outer tips of said nipples to said switches.

13. A converter as claimed in claim 13, wherein the length of said nipples is at least twice the width thereof.

* * * * *